United States Patent
Hashimoto et al.

(10) Patent No.: US 10,167,988 B2
(45) Date of Patent: Jan. 1, 2019

(54) MANUFACTURING WORK MACHINE

(71) Applicant: FUJI CORPORATION, Chiryu (JP)

(72) Inventors: Hideki Hashimoto, Miyoshi (JP); Atsushi Yamazaki, Nishio (JP); Kazuhisa Kamiyama, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/565,981

(22) PCT Filed: Apr. 20, 2015

(86) PCT No.: PCT/JP2015/061945
§ 371 (c)(1),
(2) Date: Oct. 12, 2017

(87) PCT Pub. No.: WO2016/170567
PCT Pub. Date: Oct. 27, 2016

(65) Prior Publication Data
US 2018/0112814 A1   Apr. 26, 2018

(51) Int. Cl.
*F16M 1/00*   (2006.01)
*B25J 15/00*   (2006.01)
(Continued)

(52) U.S. Cl.
CPC ............... *F16M 1/00* (2013.01); *B23P 19/04* (2013.01); *B23Q 1/62* (2013.01); *B25J 15/00* (2013.01);
(Continued)

(58) Field of Classification Search
CPC .......... F16M 11/02; B25J 15/00; B23Q 1/62; H05K 13/04
(Continued)

(56) References Cited

U.S. PATENT DOCUMENTS

2006/0236530 A1   10/2006   Andersch
2008/0265125 A1*  10/2008   Ye ........................ G06F 1/187
                                                  248/672
2013/0046402 A1   2/2013   Kodama et al.

FOREIGN PATENT DOCUMENTS

CN   202087922 U   12/2011
JP   4210656 B2   4/2006
(Continued)

OTHER PUBLICATIONS

International Search Report dated Jul. 21, 2015 in PCT/JP2015/061945 filed Apr. 20, 2015.
(Continued)

*Primary Examiner* — Todd M Epps
(74) *Attorney, Agent, or Firm* — Oblon, McClelland, Maier & Neustadt, L.L.P.

(57) ABSTRACT

A manufacturing work machine including a beam member arranged in an X-axis direction of an XY horizontal plane, both ends of the beam member being supported to be movable in the Y-axis direction; a Y-axis drive device provided on one drive side end section of the beam member, the Y-axis drive device being configured to move the beam member in the Y-axis direction; and an X-axis drive member configured to move a work head provided on the beam member in the X-axis direction, wherein the beam member is a tube with an internal hollow running through in the X-axis direction, and is formed such that a beam width in the Y-axis direction is uniform, and a height direction dimension becomes smaller from the drive side end section to an end section on another side.

5 Claims, 6 Drawing Sheets

(51) Int. Cl.
    *B23Q 1/62*         (2006.01)
    *H05K 13/04*      (2006.01)
    *B23P 19/04*      (2006.01)
    *B25J 21/00*      (2006.01)
    *H05K 13/00*      (2006.01)

(52) U.S. Cl.
    CPC .............. *B25J 21/00* (2013.01); *H05K 13/00* (2013.01); *H05K 13/04* (2013.01)

(58) Field of Classification Search
    USPC ........................................................ 248/672
    See application file for complete search history.

(56) References Cited

FOREIGN PATENT DOCUMENTS

| | | |
|---|---|---|
| JP | 2011-253869 A | 12/2011 |
| JP | 2012-64782 A | 3/2012 |

OTHER PUBLICATIONS

Extended European Search Report dated Jul. 12, 2018 in corresponding European Patent Application No. 15889808.0 citing documents AO and AP therein, 9 pages.

\* cited by examiner

MANUFACTURING WORK MACHINE

TECHNICAL FIELD

The present application relates to a manufacturing work machine provided with a beam member with a shape that maintains rigidity.

BACKGROUND ART

Among manufacturing work machines, there are machines such as assembly work machines that perform assembly work of electronic circuits, an example of which is disclosed in patent literature 1 below. This manufacturing work machine is provided with XY drive devices capable of moving a work head that performs assembly of components in a horizontal XY plane. The Y-axis drive device is configured from a beam member arranged in the X-axis direction across two rails that extend parallel to each other in the Y-axis direction, with the beam member being movable along the rails via a linear motor provided at one of the drive side end sections. Also, the X-axis drive device is configured from a slider attached to a beam member in a slidable manner, the slider being movable along the beam member that is arranged in the X-axis direction by the rotational output of a servo motor being converted to linear motion by a ball screw mechanism. Also, a work head provided with a suction nozzle is loaded on the slider.

CITATION LIST

Patent Literature

Patent literature 1: JP-A-2011-253869
Patent literature 2: JP-4210656

SUMMARY

Technical Problem

With the conventional manufacturing work machines above, components are picked from a component supply device by a work head that moves in a horizontal XY plane and then the components are assembled on a board that is conveyed by a conveyance device. Accordingly, if the moving range of the work head is widened, the work region is expanded, which improves the performance of the manufacturing work machine. Therefore, it is necessary to widen the moving range of the work head in the X-axis direction, meaning that a beam member that is longer than conventional beam members is desirable.

However, with the configuration of a conventional beam member, if the beam member is made longer, it is no longer possible to achieve sufficient rigidity. Also, in a case of increasing the width of the beam member along with increasing the length in order to maintain rigidity, the moving distance within a predetermined beam member moving range is shortened, thus narrowing the work range of the work head by that amount. Further, there are also problems to be avoided such as an increase in weight due to reinforcements for increasing the rigidity of the beam member, or increased costs due to materials used for the beam member.

Thus, to solve the above problems, an object of the present disclosure is to provide a manufacturing work machine provided with a beam member with a shape that maintains rigidity.

Solution to Problem

A manufacturing work machine that is an embodiment of the disclosure includes: a beam member arranged in an X-axis direction of an XY horizontal plane, both ends of the beam member being supported to be movable in a Y-axis direction; a Y-axis drive device provided on one drive side end section of the beam member, the Y-axis drive device being configured to move the beam member in the Y-axis direction; and an X-axis drive member configured to move a work head provided on the beam member in the X-axis direction, wherein the beam member is a tube with an internal hollow running through in the X-axis direction, and is formed such that a beam width in the Y-axis direction is uniform, and a height direction dimension becomes smaller from the drive side end section to an end section on another side.

Advantageous Effects

According to the disclosure, because the beam member is a tube with an internal hollow running through in the X-axis direction, with a constant beam thickness in the Y-axis direction, and a height dimension that becomes smaller from the drive side end section to an end section on another side, even when the width is restricted, rigidity is maintained thanks to the height of the drive side end section. Thus, the beam member can be made longer while curtailing the width direction dimension, the moving range of the beam member in the Y direction and the moving range of the work head moved by the beam member is widened, meaning that the work region of the work head is expanded.

DESCRIPTION OF EMBODIMENTS

Figure 1:
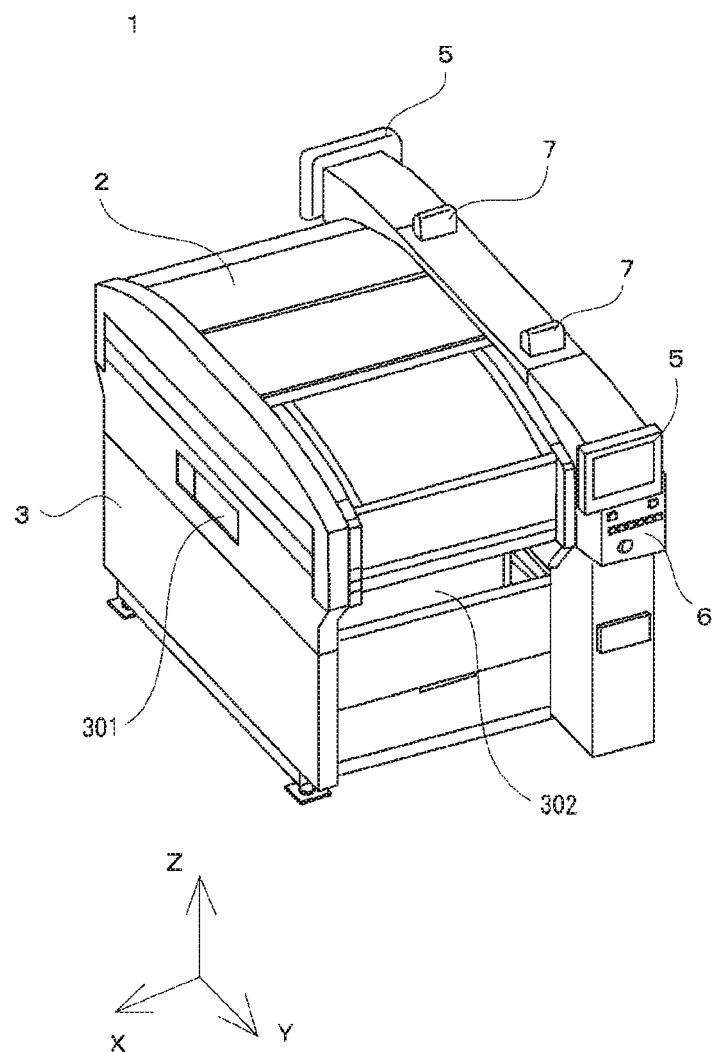
FIG. 1 is an external perspective view showing an embodiment of a manufacturing work machine.
Figure 2:
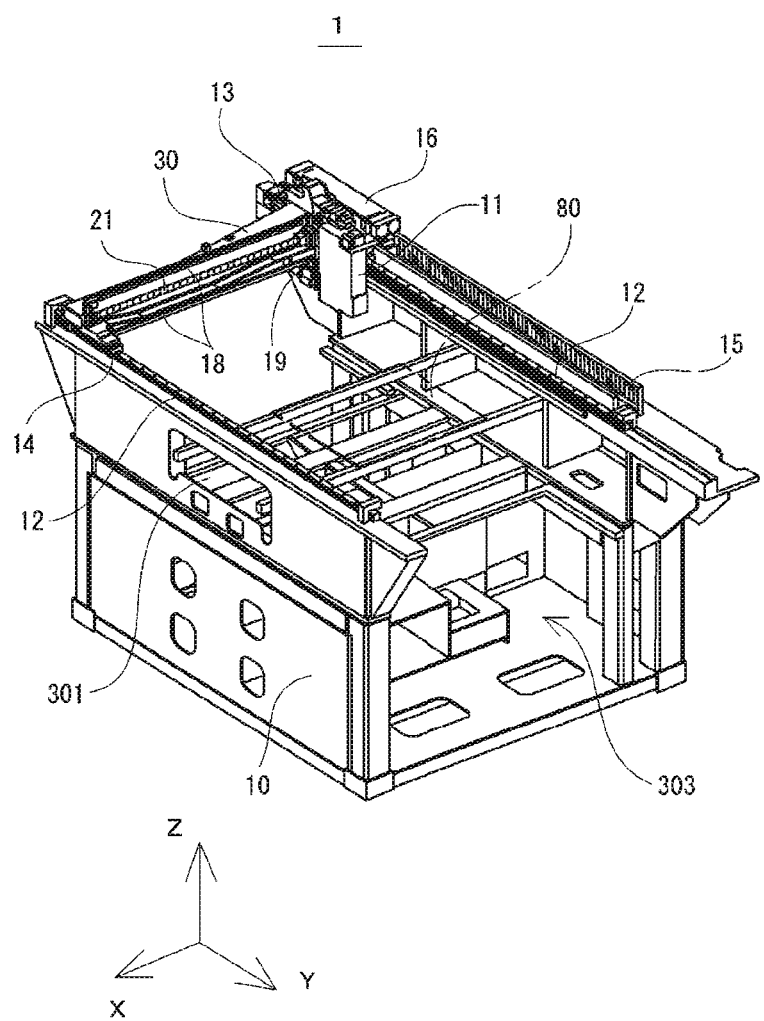
FIG. 2 is a perspective view showing the configuration of a frame of the embodiment of the manufacturing work machine with external panels removed.

Hereinafter, an embodiment of the present disclosure of a manufacturing work machine will be described with reference to the figures. FIG. 1 is an external perspective view showing an embodiment of a manufacturing work machine. FIG. 2 is a perspective view showing the configuration of a frame of the embodiment of the manufacturing work machine with external panels removed. As with the above conventional examples, manufacturing work machine 1 is an assembly work machine that performs assembly work of components as manufacturing work, for example, assembly of selecting a specified component from multiple supplied components and assembling the components onto a board. Therefore, manufacturing work machine 1 is configured from a conveyance device for conveying a board, a component supply device for supplying components, a work head for directly handling the components, drive devices, and so on.

Manufacturing work machine 1 is covered by external panels of upper section cover 2 and side surface cover 3. Monitor 5 and operation panel 6 are provided on upper section cover 2 at the front and rear of the machine body, and signal lamps 7 are also arranged at the front and rear. Board conveyance openings 301 are provided at both the left and right sides of side surface cover 3, such that boards can be loaded and unloaded between adjacent work machines. Also, component supply openings 302 are provided at the front and rear directions such that component supply devices loaded with multiple supply components can be arranged. Note that, with the present embodiment, the front-rear direction of manufacturing work machine 1 is the Y-axis direction, the left-right width direction in which boards are conveyed is the X-axis direction, and the height direction is the Z-axis direction.

With manufacturing work machine 1, as shown in FIG. 2, board 80 indicated by the broken line is positioned in the center of the machine body, and component assembly work is performed at that position. Although not shown in detail, the conveyance device that conveys board 80 is configured from a pair of conveyor belts that support edges of board 80 and are revolved by a conveyance motor. Thus, board 80 is moved in a widthwise left-right direction by the conveyance device, with loading and unloading being performed via left and right board conveyance openings 301, and board 80 being stopped and positioned as shown at a work position inside the machine body. A component supply device, such as a tray unit with casters that is movable, is arranged on device attachment section 303 of manufacturing work machine 1 shown in FIG. 2. One component tray from among multiple component trays is fed inside the device during assembly work, such that components can be removed by work head 11.

Work head 11 is for assembling components supplied from the component supply device onto board 80 that is on the conveyance device. Work head 11 is provided with a component suction nozzle that protrudes downwards and is configured to pick up and release a component using negative and positive air pressure. A drive device for moving such a work head 11 in an XY horizontal plane is provided in manufacturing work machine 1. Note that, movement in the Z-axis direction is performed using a Z-axis drive mechanism provided on work head 11 itself that raises and lowers the component suction nozzle.

The drive device is assembled on an upper section of frame 10 and is configured from a Y-axis drive device that moves work head 11 in a straight line in a front-rear direction (Y-axis direction) of the machine body, and an X-axis drive device that moves work head 11 in a straight line in a left-right widthwise direction (X-axis direction). Thus, by controlling both drive devices, it is possible to move work head 11 to any position in the XY plane. With manufacturing work machine 1, a pair of Y-axis rails 12 that extend in the Y-axis direction are provided on an upper section of frame 10 that configures the main body. And, beam member 30 that extends in the X-axis direction is provided on the pair of Y-axis rails 12 so as to straddle the upper section of frame 10.

Y-axis sliders 13 and 14 are fixed to the ends of beam member 30 such that beam member 30 is slidable on the pair of Y-axis rails 12 via the Y-axis sliders 13 and 14. That is, beam member 30 is assembled in a state to be movable in the Y-axis direction while maintaining the same arrangement in the X-axis direction. And, linear guide 13 is arranged parallel to and on the outside of one of the two Y-axis rails 12. Linear guide 15 is a thin member arranged so as to be open at the top, and is provided with a magnet on the inside as a stator. Also, linear slider 16 on which is loaded an electromagnetic coil as a moving element is provided with respect to linear guide 15. The Y-axis drive device is a linear motor configured from such a linear guide 15 and linear slider 16, and an end of beam member 30 is linked to linear slider 15 via Y-axis slider 13.

Work head 11 is slidably loaded on beam member 30 so as to be movable in the X-axis direction by the X-axis device. Rail fixing sections 341 are provided on one side of beam member 30 at both a top end and a bottom end section (refer to FIG. 6), and a pair of X-axis rails 18 arranged along the X axis are fixed to the rail fixing sections 341. Also, X-axis slider 19 on which work head 11 is loaded is slidably attached to X-axis rails 18. Further, a servo motor is loaded on beam member 30, and screw shaft 21 connected to the servo motor is provided between the pair of top and bottom X-axis rails 18. Screw shaft 21 is arranged parallel to X-axis rails 18, and is rotatably supported on the end sections of beam member 30 in the lengthwise direction via bearings. A nut fixed to Y-axis slider 19 is engaged with screw shaft 21. In this manner, the X-axis drive device is configured from a ball screw mechanism that converts rotation of the servo motor into linear motion.

With manufacturing work machine 1, assembly work of assembling components onto board 80 is performed using such drive devices. That is, work head 11 is positioned at any position on the XY horizontal plane by being moved in a straight line in the X-axis direction and in a straight line in the Y-axis direction. For movement in the X direction, screw shaft 21 is rotated by the driving of the servo motor provided on beam member 30, such that work head 11 is moved in the X-axis direction along X-axis rails 18 via the nut engaged with screw shaft 21. On the other hand, for movement in the Y-axis direction, a moving magnetic field is created in the electromagnetic coil by supplying a drive current, and a moving propulsion force is generated in the axis direction by interaction between the magnetic field and the magnetic field of the magnets. Thus, the moving element moves in a direction parallel to the axis line of the stator, and linear slider 16 is moved along linear guide 15. Therefore, beam member 30 holding work head 11 that is provided as one body with linear slider 16 is moved in the Y-axis direction.

Note that, beam member 30 is a guide member for guiding X-axis direction movement of work head 11, and is also a moving platform that moves loaded work head 11 in the Y-axis direction. And, one end section of beam member 30 is connected to linear slider 16 to be a fixed end that is constrained, and the other end section of beam member 30 is free in the Y-axis direction. Therefore, beam member 30 is supported on one side with respect to movement in the Y-axis direction, and when stopping and moving inertial force due to the weight of the beam member itself acts, and vibration (yoking mode) is generated with the drive side end section of linear slider 15 as the origin point. The performance of manufacturing work machine 1 depends on the vibration characteristics of beam member 30 on which work head 11 is loaded, therefore it is necessary to curtail vibration as much as possible in order to improve performance.

In particular, because manufacturing work machine 1 of the present embodiment has an extended work region for work head 11, the length dimension of beam member 30 is 50% larger than a conventional beam member. Accordingly, the distance from the one-sided support fixing side end section to the free end is longer by the length of beam member 30, such that the bending moment at the fixing side end section is larger. As a result, if the rigidity of beam member 30 is low, vibrations due to movement in the Y-axis direction become larger. Thus, the rigidity with respect to bending must be increased as the length dimension of beam member 30 is increased. Also, twisting also occurs due to work head 11 sliding along one side of beam member 30. Therefore, beam member 30 must be made more rigid with respect to twisting too.

A conventional beam member has a welded sheet metal construction with reinforcement ribs for increasing the strength of the beam main body that is made from sheet metal. A configuration for increasing rigidity using reinforcement ribs is disclosed in the above patent literature 2. However, the weight of a beam member with reinforcement ribs added increases, which makes the Y-axis drive device larger, increases the inertia when moving and stopping, and has a negative impact on vibrations. Thus, with the new beam member 30 used in the present embodiment, changes have been made from the conventional construction of a sheet metal assembly in order to increase the rigidity to counter bending and twisting while curtailing increases in weight. Specifically, the beam member is formed by casting and is a tubular shape with a roughly rectangular cross section.

The material for manufacturing beam member 30 should be light with excellent rigidity characteristics. For this, one would usually consider a composite of metal and ceramic such as MMC (metal matrix composite). However, metal matrix composite is not only expensive itself, it requires an expensive cutting tool to be used for machine tooling. With a casting of metal matrix composite, because hard particles and strengthening fibers are distributed on the surface, the workability in terms of boring, grinding, and honing is extremely poor, so the cutting tool used by the machine tools for these processes must be a custom one. Also, because it is not a uniform material, choosing the cutting speed is difficult, and there are issues such as a short lifespan of the tool. This increases the cost of beam member 30 and the manufacturing cost of manufacturing machine 1.

Thus, in the present embodiment, a casting aluminum alloy, which is cheap and has excellent workability is used. For the casting aluminum alloy, an item registered to JIS standards may be used, for example, Al—Si alloy, Al—CU alloy, or Al—Mg alloy. With beam member 30 of the present embodiment, DX80 (Al-16Si-5Ni-4Cu—Fe—Mn—Cr—Ti) by Nikkei MC Aluminium is used. Also, by using such a casting aluminum alloy, casting manufacturing becomes an option, and compared to a sand mold casting, deformities and defects are fewer, the forming accuracy is better, and a thinner thickness is possible.

Figure 3:
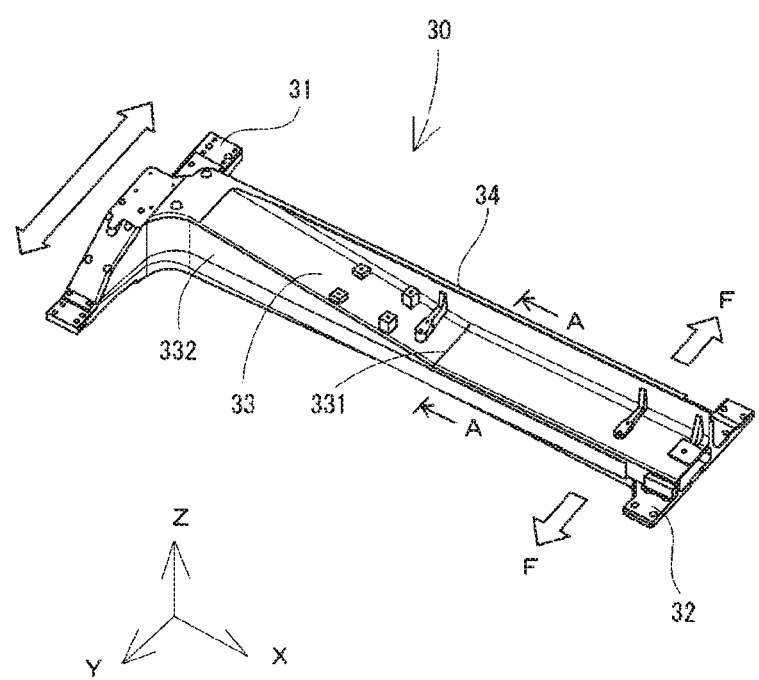
FIG. 3 is a perspective view showing a beam member of the manufacturing work machine.
Figure 4:
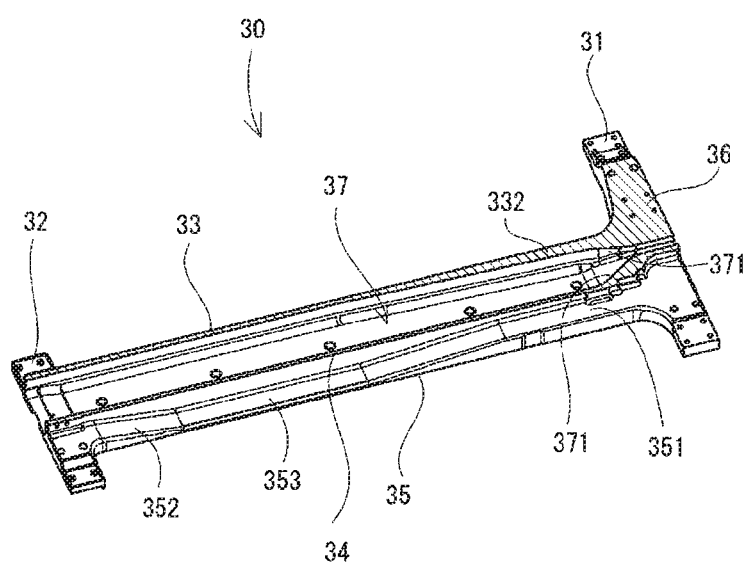
FIG. 4 is a perspective cross section showing the beam member cut along an XY plane.
Figure 5:
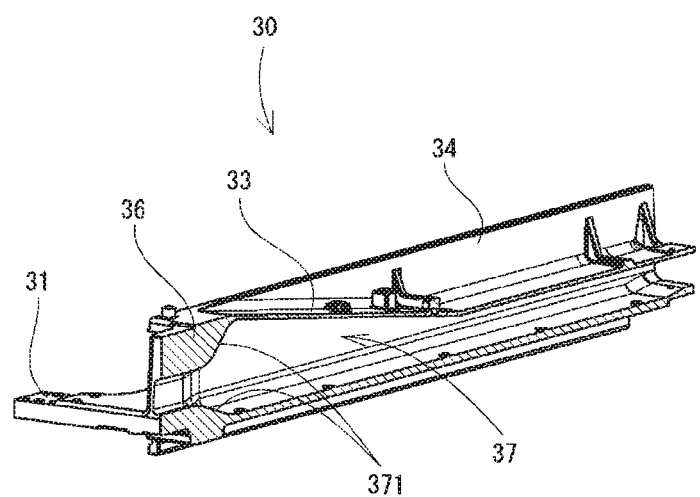
FIG. 5 is a perspective cross section showing the beam member cut along a ZX plane.
Figure 6:
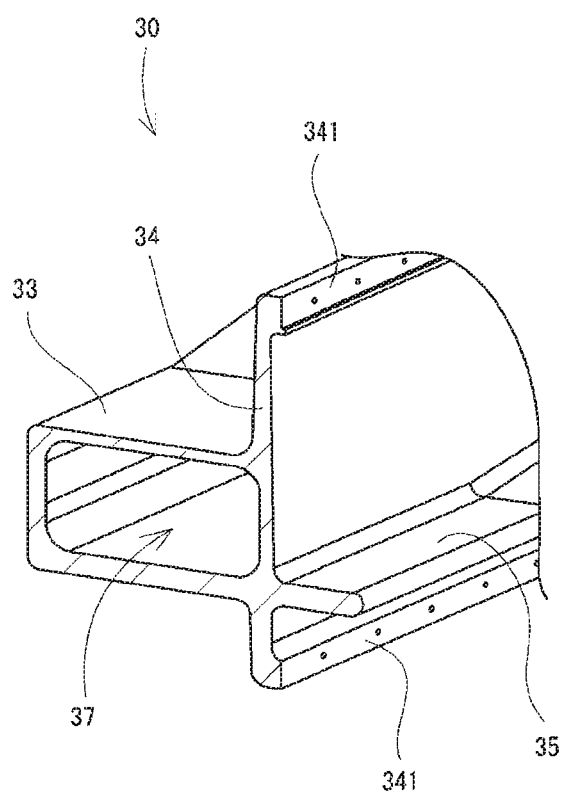
FIG. 6 is a perspective cross section of the beam member cut along line A-A of FIG. 3.

Further, casting aluminum alloy, as given above, is cheap and has excellent workability. However, depending on the type of alloy, there are materials with a low Young's modulus compared to metal matrix composite. Therefore, there is an issue of maintaining rigidity with respect to bending and twisting in order to no lower the vibration characteristics of beam member 30. With respect to this point, in the present embodiment, tubular beam member 30 is designed with a shape that provides increased rigidity. FIG. 3 is a perspective view showing beam member 30 of the present embodiment. Also, FIG. 4 is a perspective cross section showing the beam member cut along an XY plane and FIG. 5 is a perspective cross section showing the beam member cut along a ZX plane. Further, FIG. 6 is a perspective cross section of the beam member cut along line A-A of FIG. 3.

Beam member 30 has fixing sections 31 and 32 formed at both ends in the lengthwise direction, which is the X-axis direction. Fixing sections 31 and 32 are fixed to Y-axis sliders 13 and 14 that slide along the pair of Y-axis rails 12; fixing section 31 is a fixing side end section, and fixing section 32 is a free side end section. That is, Y-axis slider 13 to which fixing section 31 is attached is connected so as to be integrated with the adjacent linear slider 16 of the Y-axis drive device, such that drive power from the Y-axis drive device is transferred to beam member 30 in the directions shown by the white arrow in FIG. 3 with respect to fixing section 31. On the other hand, because the fixing section 32 side is a free end in the Y-axis direction as given above, during moving and stopping, inertia force F acts on beam member 30 due to its own weight. Thus, to make the inertia force F small, fixing section 32 is small, and the area of fixing section 31 for which the bending moment value is large is made to be large.

Beam member 30 is configured from tubular beam main body section 33 between fixing sections 31 and 32, side wall section 34 to which work head 11 is slidably attached, and rib section 35 perpendicular to side wall section 34. The width dimension of beam member 30 formed from these beam main body section 33, side wall section 34, and rib section 35 is fixed. In particular, the width dimension is fixed even if the attachment position of work head 11 is the opposite side beam main body section 33. Note that, actually, with respect to movement in the Y-axis direction, for a beam member 30 held at one side, it is desirable to make the width of the fixing section 31 side that is the fixing side end section large with respect to the bending moment that acts.

However, if the width dimension of beam member 30 is made large, the predetermined moving range in the Y-axis direction in manufacturing work machine 1 is narrowed by that amount, which narrows the work region of work head 11. That is, despite the fact that beam member 30 is made longer to widen the moving range in the X-axis direction, this effect is negated by the fact that the moving range in the Y-axis direction of beam member 30 is narrowed. Thus, with the present embodiment, to increase the rigidity while keeping the width dimension of beam member 30 fixed, beam main body section 33 and rib section 35 have the following configuration.

Beam main body section 33 is formed such that the height dimension in the Z-axis direction is large at the fixing section 31 side and small at the fixing section 32 side. In particular, beam main body section 33 is formed slanted so that the height gradually becomes lower from the fixing section 31 side to intermediate position 331, and has a fixed height from the intermediate position 331 to the fixing section 32 side. That is, it is desirable for the second moment of area to be large to increase the rigidity against bending, but as given above, for the portion that the width dimension cannot be made larger, the height dimension is made larger. However, at a position far from fixing section 31, to make inertia force F smaller, it is necessary to curtail the weight of beam member 30.

Thus, beam main body 33 is configured with an overall weight to maintain the required rigidity at given locations especially while decreasing the weight at the fixing section 32 side further from fixing section 31. Specifically, as given above, not only is the configuration slanted until intermediate position 331, but side wall 332 on the opposite side to side wall section 34, as shown in FIG. 4, gets gradually thinner from the fixing section 31 side to intermediate position 331, and has a fixed thickness from intermediate position 331 to fixing section 32. On the other hand, the thickness of side wall section 34 perpendicular to which is rib section 35 is fixed. In such manner, beam main body section 33 is an overall thin tube, with large internal hollow 37 formed inside.

However, with fixing end section 36 connected to beam main body section 33, as shown in FIGS. 4 and 5, to achieve greater rigidity, the thickness is such that internal hollow 37 is smaller. Accordingly, internal hollow 37 suddenly increases in size from fixing end section 36 to beam main body section 33, such that there is a large change in the cross-section area in the X-axis direction. Stress becomes concentrated at a location at which the shape changes suddenly. To mitigate this concentration of stress, internal wall surface 371 in the horizontal and verticals directions at the location is a slanted surface, and is formed such that the angles between the internal wall surfaces that meet in the X-axis direction are obtuse. Also, the surfaces between slanted internal wall surface 371 and adjacent internal wall surfaces are curved. Further, with respect to this point, the same applies to outer side surfaces connected to fixing end section 36 and beam main body surface 33, with both being curved surfaces.

Beam member 30 has rib section 35 formed on the side wall section 34 side to which work head 11 is attached, such that the rigidity with respect to bending and twisting is high. Rib section 35 extends in the horizontal direction perpendicular to side wall section 34 and is formed along the entire length of beam member 30. Therefore, although it is necessary to have a certain thickness to increase the rigidity of beam member 30, rib section 35 used for reinforcement increases the weight of beam member 30, causing other unwanted consequences. Thus, with the present embodiment, to reduce the weight while maintaining the required rigidity, the thickness of rib section 35 varies.

Rib section 35 is formed such that end portions 351 and 352 at both ends in the lengthwise direction are thick, and intermediate portion 353 is thin. End portions 351 and 352 are formed to slant towards intermediate portion 353, such that stress is not concentrated at those points. Also, because a bending moment acts largely on the fixing section 31 side, the range of end portion 351 is wide. On the other hand, end portion 352 on the fixing section 32 side counters twisting and bending, but because the bending moment value is small, the range of end portion 352 is narrow. Also, because the influence of bending on intermediate portion 353 is small and intermediate portion 353 is more for countering twisting, the thickness of intermediate portion 353 is that capable of countering the twisting force.

Thus, according to manufacturing work machine 1, because the lengthwise dimension of beam member 30 is made longer while curtailing the width direction dimension, the moving range of beam member 30 in the Y direction and the moving range of work head 11 moved by beam member 30 is widened, meaning that the work region of work head 11 is expanded. In particular, according to the present embodiment, compared to metal matrix composite, relatively cheap casting aluminum alloy is used, curtailing costs and achieving the effects given above.

On the other hand, compared to metal matrix composite, casting aluminum alloy has a lower Young's modulus, leading to a problem of vibration at beam member 30 for which the width dimension is limited. For this point, with beam member 30 of the present embodiment, there is a dimension limit in the width direction, but beam main body section 33 is tubular, and the height dimensions of fixing end section 36 and the end section of the fixing section 51 side of beam main body 33 are high, which curtails vibrations while maintaining rigidity. Also, beam member 30 includes tubular beam main body section 33, upright side wall section 34, and horizontally protruding rib section 35 to achieve rigidity to counter bending and twisting. Further, beam member 30, at the fixing section 31 side for which the bending moment is large, fixing end section 36 is a thick block for which internal hollow 37 is small, and beam main body section 33 has side wall 332 formed of a thickness to increase rigidity.

Vibration with respect to beam member 30 is caused by inertia acting due to movement in the Y-axis direction. Therefore, with the present embodiment, locations requiring a given rigidity are identified, and the thickness of those sections is changed, thereby reducing the weight of beam member 30. Specifically, with side wall 332, the thickness of the fixing section 31 side portion gets thinner towards the fixing section 32 side, and with rib section 35, the thickness changes between end portions 351 and 352 and intermediate portion 353.

The above describes an embodiment of the present disclosure, but embodiments are not limited to these and various changes may be employed without departing from the scope of the disclosure. For example, the specific shape of minor portions of beam member may be different to that of the present embodiment. Also, the material used for beam member 30 may be a casting aluminum alloy other than Nikkei MC Aluminium DX 80.

REFERENCE SIGNS LIST

1: manufacturing work machine; 11: work head; 12: Y-axis rail; 13, 14: Y-axis slider; 15: linear guide; 16: linear slider; 18: X-axis rail; 21: screw shaft; 30: beam member; 31, 32: fixing section; 33: beam main body section; 34: side wall section; 35: rib section; 36: fixing end section; 37: internal hollow

The invention claimed is:

1. A manufacturing work machine comprising:
    a beam member arranged in an X-axis direction of an XY horizontal plane, both ends of the beam member being supported to be movable in a Y-axis direction;
    a Y-axis drive device provided on one drive side end section of the beam member, the Y-axis drive device being configured to move the beam member in the Y-axis direction; and
    an X-axis drive member configured to move a work head provided on the beam member in the X-axis direction, wherein
    the beam member is a tube with an internal hollow running through in the X-axis direction, and is formed such that a beam width in the Y-axis direction is uniform, and a height direction dimension becomes smaller from the drive side end section to an end section on an other side.

2. The manufacturing work machine according to claim 1, wherein
    a height dimension of the beam member continuously gets smaller from the drive side end section to an intermediate section in the X-axis direction, and the height dimension of the beam member is substantially fixed from the intermediate section to the end section on the other side.

3. The manufacturing work machine according to claim 1, wherein the work head is attached to one of a pair of side surfaces of the beam member that are provided upright in the Y-axis direction, and the other of the side surfaces is formed to be thicker than the side surface.

4. The manufacturing work machine according to claim 3, wherein
the thickness of the other of the side surfaces of the beam member differs at various locations in the X-axis direction.

5. The manufacturing work machine according to claim 1, wherein the beam member is formed from a casting aluminum alloy.

* * * * *